United States Patent

Atkins

[15] 3,670,178

[45] June 13, 1972

[54] CONTROL CIRCUIT WITH ANTI-SWITCHING AND ANTI-NOISE CIRCUITRY

[72] Inventor: Carl E. Atkins, Montclair, N.J.

[73] Assignee: Wagner Electric Corporation

[22] Filed: April 17, 1970

[21] Appl. No.: 29,548

[52] U.S. Cl. ..........................307/202, 307/252 J, 307/255, 330/149

[51] Int. Cl. ..........................H02h 7/20

[58] Field of Search ..........................330/28, 94, 149; 328/265; 307/202

[56] References Cited

UNITED STATES PATENTS

| | | | |
|---|---|---|---|
| 2,364,403 | 12/1944 | Terman | 330/149 |
| 3,421,101 | 1/1969 | Drew et al. | 330/28 X |
| 3,260,915 | 7/1966 | Gregg | 307/202 X |

OTHER PUBLICATIONS

Brown, " Get Rid of Ground-Loop Noise," Electronic Design, July 15, 1969, pp. 84-86

*Primary Examiner*—Roy Lake
*Assistant Examiner*—James B. Mullins
*Attorney*—Eyre, Mann & Lucas

[57] ABSTRACT

A phase-shifting circuit connected in the output circuit of the first amplifier stage in a control circuit causes cancellation of transient signals at the input terminals of the amplifier. The magnitude of such transients appearing on the neutral line is reduced by a resistance between nominal ground and the neutral line and a filtering capacitor between the neutral line and true ground. A safety capacitor connected between true ground and the bias circuit of a switch of the control circuit prevents a change in the state of the switch if the wrong circuit terminal is connected to the hot terminal of the power source. Circuitry for degrading the amplification of low-frequency sinusoidal components of the output of the final amplifier stage is provided.

5 Claims, 1 Drawing Figure

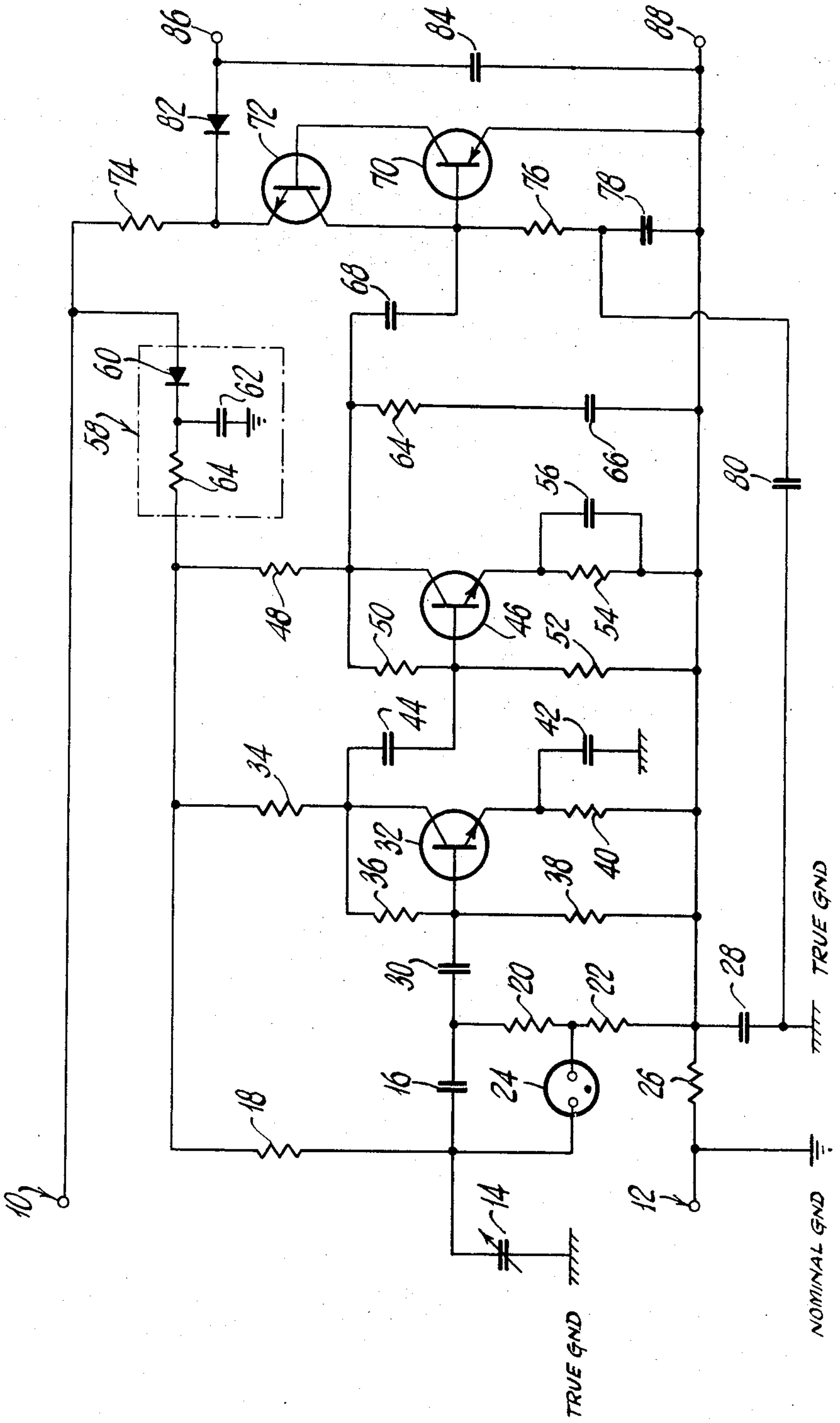
INVENTOR
CARL E. ATKINS
BY
Eyre, Mann & Lucas
ATTORNEYS

CONTROL CIRCUIT WITH ANTI-SWITCHING AND ANTI-NOISE CIRCUITRY

The present invention relates to improvements in control circuitry, particularly capacitance-responsive control circuitry. In the disclosed embodiment of the present invention, any transient signal appearing at the base of the first transistor of the two-stage transistor amplifier is cancelled out by the in-phase appearance at the common terminal of that transistor of a signal having a similar waveform. The cancelling signal at the emitter is provided by means of a circuit preferably comprising a capacitance connected between the common terminal and true ground and a resistance connected between the common terminal and the neutral line. In addition, low-side filtering is provided by connecting a capacitance between the neutral line and true ground and a resistance between the neutral line and nominal ground. Also, a safety circuit in the form of a capacitance connected between true ground and the bias circuit of the output-controlling switch is provided to prevent operation of that switch in the event of accidental reversal of circuit terminal connections to the power source. Finally, the second stage transistor of the aforementioned two-stage transistor amplifier has a resistance and a capacitance connected in parallel between the common terminal and the neutral line in order to effect a high degree of degeneration of the amplification of the low-frequency components of the output wave without significant degeneration of the high-frequency components of the output wave.

A better understanding of the present invention may be had by reference to the accompanying drawing which is a schematic circuit diagram of a preferred embodiment incorporating the aforementioned improvements. A standard AC power source (102–130 volts RMS, 60 hertz) is to be connected between terminals 10 and 12 to energize the circuit. In this embodiment, a pulse-generating capacitance-responsive relaxation oscillator comprising variable capacitance 14, fixed capacitance 16, resistances 18, 20 and 22 and neon tube 24 is employed. This relaxation oscillator is described and claimed in U. S. Pat. No. 3,119,033 issued on Aug. 3, 1965 to Carl E. Atkins et al. The values of the oscillator circuit components may be selected to provide output pulses of a predetermined peak voltage at the junction of capacitor 16 and resistor 20. Variations in capacitance 14 will cause this output to vary. Resistances 20 and 22 are connected in series from the neutral line, which is connected to nominal ground through resistance 26 and to true ground (e.g., a water pipe) through capacitance 28, to capacitance 30.

The output of the relaxation oscillator is thus provided through capacitor 30 to the input terminal (base) of transistor 32, which, along with the biasing and load resistances 34, 36, and 38 and the phase-shifting circuit comprising resistance 40 and capacitance 42, forms the first stage of a two-stage amplifier. The output of this first stage is derived from the junction of resistor 34 and the output terminal (collector) of transistor 32, and is provided through blocking capacitor 44 to the input terminal (base) of transistor 46, which, in combination with the bias and load resistors 48, 50 and 52 and the frequency-selective degeneration circuit comprising resistance 54 and capacitance 56, forms the second stage of the two-stage amplifier. Both stages of this amplifier and the relaxation oscillator are provided with DC power by a conventional AC–DC conversion circuit 58 comprising diode 60, capacitor 62 and resistance 64, which converts the AC power applied to the hot line connected to terminal 10 into DC power of a suitable voltage. The output of the two-stage amplifier is derived at the junction of resistor 48 and the output terminal (collector) of transistor 46. A phase-shifting circuit comprising series-connected resistance 64 and capacitance 66 is connected between the output terminal of transistor 46 and the neutral line.

The output of the two-stage amplifier is provided through capacitance 68 to the base and collector of transistors 70 and 72, respectively. Transistors 70 and 72 are connected in the regenerative feedback configuration to form a transistor switch, which also includes a bias circuit comprising resistance 76 and capacitance 78 connected in series between the base of transistor 70 and the neutral line. This transistor switch is described and claimed in U. S. Pat. No. 3,508,120 issued on Apr. 21, 1970 to Carl E. Atkins. A current-limiting resistance 74 is connected between the hot line and the emitter of transistor 72. One terminal of a safety capacitance 80 is connected to the junction of resistance 76 and capacitance 78, and the other terminal is connected through the filtering circuit comprising capacitance 28 and resistance 26 to the circuit terminal which is normally connected to the nominal ground terminal of the AC power source. Diode 82 and capacitance 84 are connected in series between the emitter of transistor 72 and the neutral line, to which the emitter of transistor 70 is directly connected. The output controlled by transistor pair 70, 72 is derived at the terminals 86 and 88, terminal 86 being connected to the junction of diode 82 and capacitance 84 and the emitter of transistor 72, and terminal 88 being connected to the neutral line. The load current path through transistor pair 70, 72 is normally nonconductive by virtue of the positive bias voltage placed on capacitor 78, which may be overridden by a suitably large output from the two-stage amplifier. The output of the amplifier may be adjusted to maintain the transistor pair 70, 72 normally conductive by selecting the values of the relaxation oscillator circuit to provide a sufficiently large negative input to the amplifier. When the transistor pair 70, 72 is conductive, the output across terminals 86 and 88 will be essentially zero during the negative half of each cycle of applied AC power, and diode 82 will prevent the flow of current through any load connected between terminals 86 and 88 during the positive half of each cycle of applied AC power. When the transistor pair 70, 72 is non-conductive, negative current pulses conforming substantially to the waveform of the negative half-cycles of applied AC power will flow through such load. The circuit disclosed herein has utility in such applications as controlling the energization of a relay or a timing circuit.

When power is applied between terminals 10 and 12 and the circuit is operating in the steady state, various transient voltages will appear at the nominal ground connection. Low-side filtering of these transients is provided by resistance 26 and capacitance 28, the former being connected between nominal ground and the neutral line and the capacitance being connected between the neutral line and true ground. Resistance 26 serves to attenuate any noise voltage from nominal ground. Since such transients ordinarily consist largely of high-frequency sinusoidal components, capacitor 28 provides a relatively low impedance path to true ground for these components.

Although transient voltages will appear on the neutral line somewhat decreased in magnitude as a result of the IR drop across resistance 26 as a consequence of transient current flow from nominal ground through resistance 26 and capacitor 28 to true ground, such voltages will nevertheless cause current flow through resistances 22 and 20 and capacitances 16 and 14 of the relaxation oscillator circuit to true ground, thereby generating an undesirable signal at the output of the oscillator circuit. This undesired signal will be provided to the input terminal (base) of transistor 32 via capacitance 30. In order to cancel out this signal, suitable values of resistance 40 and capacitance 42 are employed to provide a parallel path for a component of the current generated by this undesired voltage through resistance 40 and capacitance 42 to true ground. Thus, a transient signal of substantially the same waveform is provided to the common terminal (emitter) of transistor 32 in phase with the transient signal provided at the input terminal (base) of transistor 32, thereby nullifying that signal. Consequently, no appreciable amplified noise component will appear in the outputs of either the first stage or the second stage of the two-stage amplifier.

In the event that terminal 12 is accidentally connected to the hot terminal of a power source and terminal 10 is connected to the neutral terminal, an overwhelmingly positive voltage will be placed upon bias capacitor 78 through the safety capacitor 80, one terminal of which is connected through filtering capacitance 28 and resistance 26 to terminal 12. Thus, the transistor pair 70, 72 will be maintained nonconductive regardless of the output of the two-stage amplifier, i.e., regardless of variations in capacitance 14. When the installer performs post-installation testing procedures, the failure of the circuit to operate will give notice of the fact that an incorrect connection has been made.

In the preferred embodiment disclosed herein, which employs a capacitance-responsive oscillator for providing the input to the two-stage amplifier, it is desirable to maintain the normal (i.e., no-signal) level of the output pulses of the oscillator circuit at as low a peak voltage level as possible in order to have the variations in output voltage constitute as large a percentage as the no-signal output as possible. The sensitivity of the oscillator (and, consequently, of the entire circuit) to small changes in capacitance 14 is thus enhanced. Adjustment of the circuit to operate in this manner introduces the problem of preventing the small amplified pulse output from getting lost in other components of the output wave of the two-stage amplifier. Specifically, the output generated at the collector of transistor 46 comprises a substantially saw-tooth shaped wave with the small amplified pulses superimposed thereon. It is desirable to reduce the magnitude of the saw-tooth wave so that the output pulses are of a comparable order of magnitude. This is accomplished by connecting resistance 54 in series between the common terminal (emitter) of transistor 46 and the neutral line, and by connecting capacitance 56 in parallel with resistance 54. Thus, the predominantly low-frequency sinusoidal components of the saw-tooth wave are substantially decreased in magnitude by this output network, whereas the predominantly high-frequency sinusoidal components of the pulses pass through capacitance 56 with relatively little decrease in magnitude.

The values of the various circuit elements of the preferred embodiment disclosed herein are as follows:

| Capacitances | Resistances |
|---|---|
| 14 — 2 to 7 picofarads | 18 — 15 megohms |
| 16 — 100 picofarads | 20 — 3.9K ohms |
| 28 — .047 microfarads | 22 — 27K ohms |
| 30 — .01 microfarads | 26 — 1K ohms |
| 42 — (very small;may be distributed C) | 34 — 390K ohms |
| 44 — .01 microfarads | 36 — 680K ohms |
| 56 — .01 microfarads | 38 — 100K ohms |
| 62 — .47 microfarads | 40 — 3.9K ohms |
| 66 — .01 microfarads | 48 — 2.2 megohms |
| 68 — 150 picofarads | 50 — 3.3 megohms |
| 78 — .1 microfarads | 52 — 150K ohms |
| 80 — .0047 microfarads | 54 — 10K ohms |
| 84 — .047 microfarads | 64 — 22K ohms |
| | 74 — 100K ohms |
| | 76 — 100K ohms |

| Transistors |
|---|
| 32 — 2N3567 |
| 46 — 2N3567 |
| 70 — 2N4248 |
| 72 — 2N3567 |

The advantages of the present invention, as well as certain changes and modifications of the disclosed embodiment thereof, will be readily apparent to those skilled in the art. It is theapplicant's intention to cover all those changes and modifications which could be made to the embodiment of the invention herein chosen for the purposes of the disclosure without departing from the spirit and scope of the invention.

What is claimed is:

1. In a transistor amplifier circuit comprising at least one stage connected between a hot line and a neutral line, and provided with input signals by a signal source connected between the said hot line and neutral line, the improvement comprising transient-cancelling circuit means connected from the neutral line and true ground to the common terminal of the transistor in the first stage, said circuit means being operative, when a first transient signal from the neutral line appears at the input terminal of said first-stage transistor, to cause a second transient signal having a similar wave form to appear at said common terminal substantially in phase with said first transient signal.

2. The improvement according to claim 1 wherein said circuit means comprises:

1. a resistance connected between the emitter of said first-stage transistor and the neutral line, and
2. a capacitance connected between the emitter of said first-stage transistor and true ground.

3. In a control circuit connected between first and second terminals normally operative to contact the hot terminal and the nominal ground terminal, respectively, of a source of alternating-current power, and comprising a signal source operative to vary its output in response to variations in detected capacitance to true ground, a multistage, transistorized signal amplifier circuit operative to amplify the output of said signal source, and a semiconductor switch comprising a bias circuit including a capacitance having one terminal connected to the neutral line, said semiconductor switch being controlled by the output of said signal amplifier circuit, the improvement comprising:

passive circuit means including a first capacitive reactance component and connected between the other terminal of said bias circuit capacitance and said second terminal of said control circuit to maintain said semiconductor switch in a predetermined state when said second terminal is improperly connected to said hot terminal of said source of alternating-current power.

4. The improvement according to claim 3 wherein said impedance further comprises a second capacitive reactance component connected to said first capacitive reactance component, with the junction of said first and second capacitive reactance components being connected to true ground.

5. The improvement according to claim 4 wherein said impedance further comprises a resistance connected between said second terminal and said second capacitive reactance component, with the junction of said resistance and said second capacitive reactance component being connected to a neutral line of said control circuit.

* * * * *